United States Patent
Luo et al.

(10) Patent No.: US 7,564,281 B2
(45) Date of Patent: Jul. 21, 2009

(54) WIDE-LOCKING RANGE PHASE LOCKED LOOP CIRCUIT USING ADAPTIVE POST DIVISION TECHNIQUE

(75) Inventors: Ren-Hong Luo, Taipei (TW); Cheng-Ta Wei, Hsinchu (TW)

(73) Assignee: Faraday Technology Corporation, Hsinchu (TW)

( * ) Notice: Subject to any disclaimer, the term of this patent is extended or adjusted under 35 U.S.C. 154(b) by 0 days.

(21) Appl. No.: 12/016,335

(22) Filed: Jan. 18, 2008

(65) Prior Publication Data

US 2008/0174349 A1    Jul. 24, 2008

(30) Foreign Application Priority Data

Jan. 19, 2007   (TW) .............................. 96102159 A

(51) Int. Cl.
*H03L 7/06* (2006.01)
(52) U.S. Cl. .................. 327/156; 327/163; 327/147; 375/376
(58) Field of Classification Search ......... 327/156–159, 327/162, 163, 147–150; 331/DIG. 2; 375/376
See application file for complete search history.

(56) References Cited

U.S. PATENT DOCUMENTS

| | | | | | |
|---|---|---|---|---|---|
| 6,008,703 | A  | * | 12/1999 | Perrott et al. | 332/100 |
| 6,594,330 | B1 | * | 7/2003  | Wilson         | 375/376 |
| 6,952,124 | B2 | * | 10/2005 | Pham           | 327/156 |
| 7,263,152 | B2 | * | 8/2007  | Miller et al.  | 375/371 |
| 7,365,580 | B2 | * | 4/2008  | Martin et al.  | 327/156 |
| 2005/0105661 | A1 | * | 5/2005 | Miller et al.  | 375/376 |

* cited by examiner

*Primary Examiner*—Lincoln Donovan
*Assistant Examiner*—Hai L Nguyen
(74) *Attorney, Agent, or Firm*—WPAT., P.C.; Justin King

(57) ABSTRACT

A wide-locking range phase locked loop circuit includes a decision unit and a closed loop connection comprising a phase frequency detector, a charge pump, a loop filter, a voltage controlled oscillator, and a multi-modulus divider. The decision unit receives a phase difference signal outputted from phase frequency detector and the control voltage outputted from the loop filter and determines to select a specific divisor form the plurality of divisors provided by the multi-modulus divider if the phase difference signal indicates an unlocked state and the control voltage is not within a standard voltage operation range.

10 Claims, 5 Drawing Sheets

WIDE-LOCKING RANGE PHASE LOCKED LOOP CIRCUIT USING ADAPTIVE POST DIVISION TECHNIQUE

FIELD OF THE INVENTION

The present invention relates to a phase locked loop (PLL) circuit, and more particularly to a wide-locking range phase locked loop circuit using the adaptive post division technique.

BACKGROUND OF THE INVENTION

Please refer to FIG. 1, which illustrates the conventional phase locked loop (PLL) circuit. The PLL circuit 100 includes a phase frequency detector 10, a charge pump 20, a loop filter 30, a voltage controlled oscillator (VCO) 40 and a divider 50. An input clock signal ($CK_{in}$) with a reference frequency ($f_{ref}$) is generated by a reference oscillator (not illustrated). Both the input clock signal and a frequency divided signal are inputted into the phase frequency detector 10. The phase frequency detector 10 detects the difference in phase and frequency between the input clock signal ($CK_{in}$) and the frequency divided signal and then outputs a phase difference signal to the charge pump 20. According to the phase difference signal, the charge pump 20 then outputs the current proportional to the amplitude of the phase difference. The output current charges capacitors C1 and C2 of the loop filter 30, thereby generates a control voltage (Vc) to the VCO 40. The VCO 40 generates an output clock signal ($CK_{out}$) with a voltage controlled frequency ($f_{vco}$) in response to the control voltage (Vc). The divider 50 receives the output clock signal ($CK_{out}$) and generates a frequency divided signal after dividing the voltage controlled frequency ($f_{vco}$) by an integer M (i.e. multiply by 1/M) for being inputted to the phase frequency detector 10. Therefore, the frequency relation between input clock signal ($CK_{in}$) and the output clock signal ($CK_{out}$) of the PLL circuit 100 is $f_{voc}=M*f_{ref}$.

As widely known, the frequency operation range of the VCO 40 is restricted in its resonant frequency; further, the control voltage (Vc) is proportional to the voltage controlled frequency ($f_{vco}$); hence, the control voltage (Vc) would be restricted within a voltage operation range. That is to say, the conventional frequency locked range of the PLL circuit 100 would be restricted to within the frequency operation range of the VCO 40.

In order to achieve PLL circuit with wide-locking range, as illustrated in FIG. 2, a PLL circuit with multi-modulus divider is proposed. The proposed multi-modulus divider 60 of the PLL circuit 150 includes a main divider 62 and a coefficient-selecting unit 64. The main divider 62 provides a basic numeric M. The coefficient-selecting unit 64 switches using the controlling pins to choose one of the coefficients from many (1, ½, ¼, . . . , ½$^N$). For example, if user selects the coefficient ½ from the coefficient-selecting unit 64, the output voltage controlled clock signal ($CK_{vco}$) with a voltage controlled frequency ($f_{vco}$) outputted from the VCO 40 is undergoing a first frequency division by the coefficient ½ to generate the output clock signal ($CK_{out}$) with an output frequency equal to $f_{vco}/2$. The output clock signal ($CK_{out}$) further undergoes a second frequency division by the main divider 62 according to the basic numeric M, which divides the output frequency ($f_{out}$) of the output clock signal ($CK_{out}$) by the integer M (multiply by 1/M) to generate the frequency divided signal with frequency equal to $f_{vco}/2M$.

The conventional multi-modulus divider 60 provides a coefficient-selecting unit 64 to the PLL circuit 150. Through dynamically selecting one value of the coefficient-selecting unit 64 and applying to the PLL circuit 150, the output frequency ($f_{out}$) of output clock signal ($CK_{out}$) can achieve the purpose of wide-locking range. However, when designing such kind of PLL circuit in an application specific integrated circuit ('ASIC'), a set of control pins are needed to be provided additionally in order to control switches (SW0~SWN) and select one coefficient in the coefficient-selecting unit 64 by user. The additional control pins or terminals would however increase difficulty of operation and the cost and complexity of design and testing.

SUMMARY OF THE INVENTION

One of the objects of the present invention is to provide a wide-locking range phase locked loop circuit with built-in auto-adjust mechanism.

The present invention provides a phase locked loop circuit including: a phase frequency detector receiving a frequency divided signal and an input clock signal with a reference frequency and detecting the difference in phase and frequency between the input clock signal and the frequency divided signal and then outputting a phase difference signal; a charge pump outputting an output current in response to the phase difference signal; a loop filter generating a control voltage in response to the phase difference signal; a voltage controlled oscillator generating a voltage controlled clock signal with a voltage controlled frequency in response to the control voltage; a multi-modulus divider receiving the voltage controlled clock signal and then generating the frequency divided signal and an output clock signal with an output frequency, wherein a first divisor can be selected from a plurality of divisors provided by the multi-modulus divider to achieve a relation that the voltage controlled frequency divided by the first divisor equals the output frequency; and a decision unit receiving the phase difference signal and the control voltage and determining to select a second divisor form the plurality of divisors provided by the multi-modulus divider if the phase difference signal indicates an unlocked state and the control voltage is not within a standard voltage operation range.

The present invention further provides a method of controlling a phase locked loop circuit, wherein the phase locked loop circuit divides a voltage controlled clock signal by a divisor for generating a frequency divided signal and generates a control voltage in response to a difference between the frequency divided signal and an input clock signal, the method including steps of: setting the divisor to an initial value; and changing the divisor if the control voltage is not within a standard voltage operation range over a period of time.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

Figure 1:
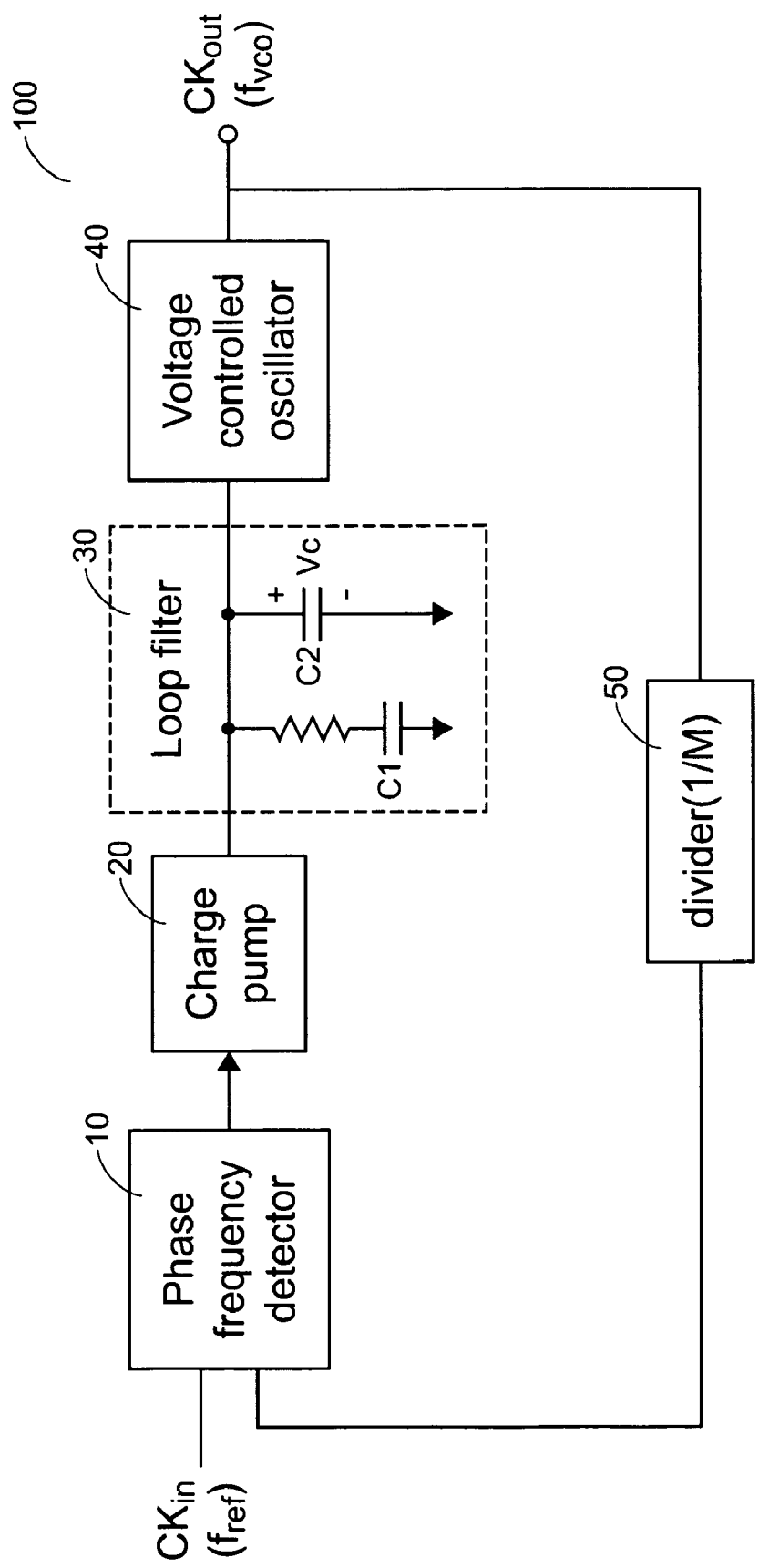
FIG. 1 illustrates the conventional phase locked loop (PLL) circuit.
Figure 2:
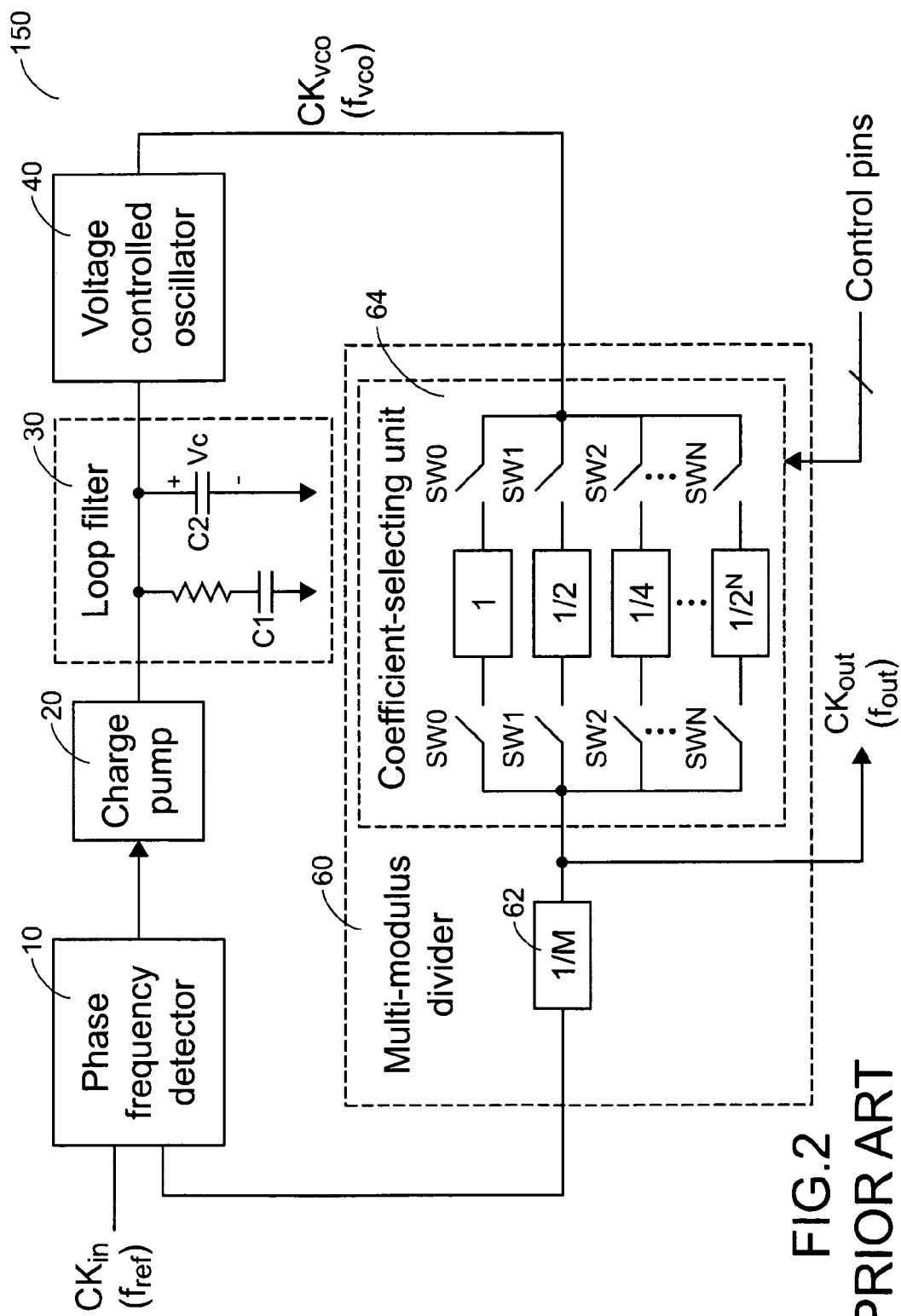
FIG. 2 illustrates a PLL circuit with multi-modulus divider.
Figure 3:
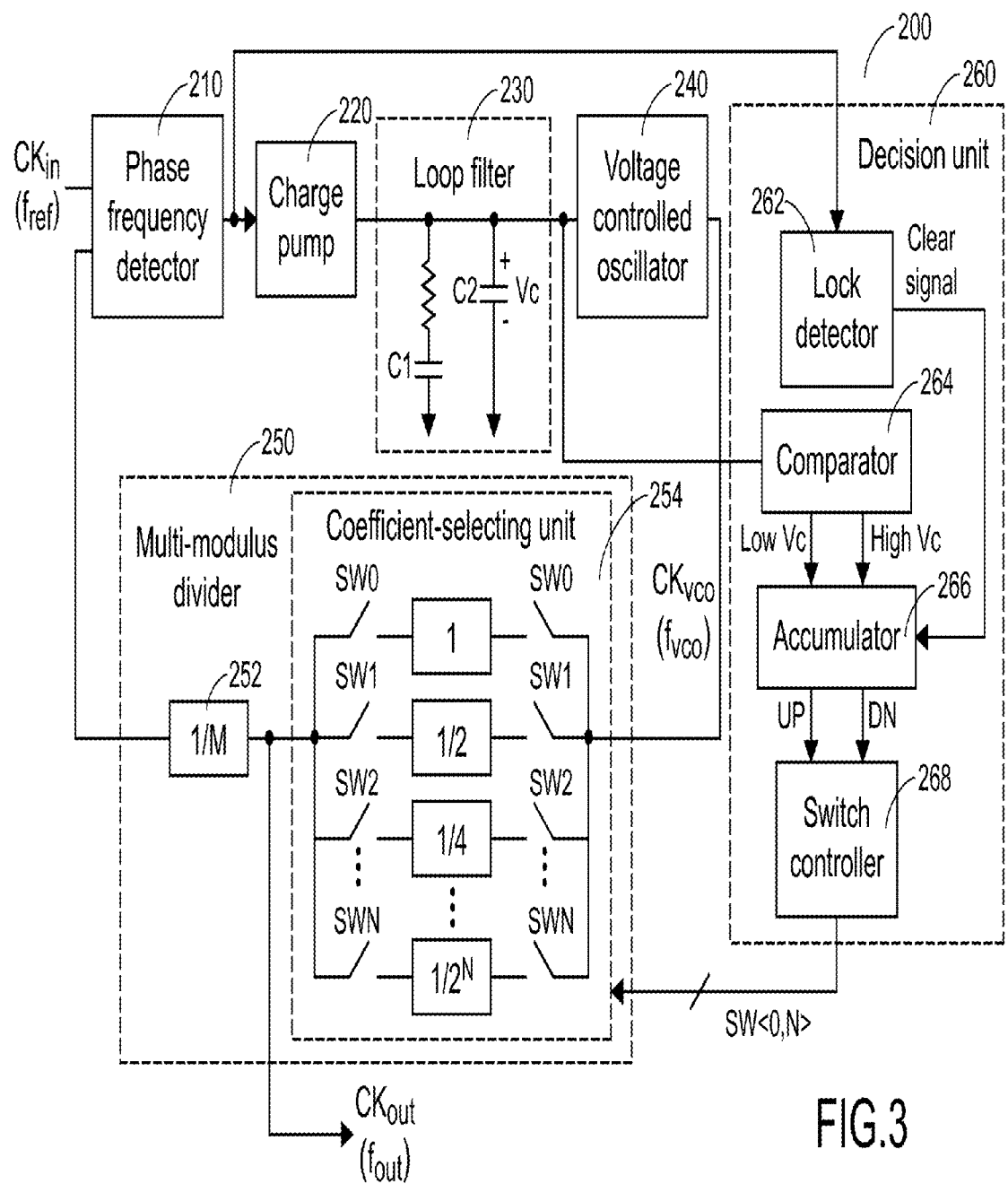
FIG. 3 illustrates the PLL circuit of the present invention.

Please refer to FIG. 3, which illustrates the PLL circuit of the present invention. The PLL circuit 200 comprises a phase frequency detector 210, a charge pump 220, a loop filter 230, a VCO 240, a multi-modulus divider 250 and a decision unit 260. The multi-modulus divider 250 comprises a main divider 252 and a coefficient-selecting unit 254. The main divider 252 provides a basic numeric value M, while the coefficient-selecting unit 254 controls switches (SW0~SWN) through the decision unit 260, which is used to choose one coefficient from several coefficients $(1, \frac{1}{2}, \frac{1}{4}, \ldots, \frac{1}{2^N})$. That is to say, after the decision unit 260 selects one coefficient from the coefficient-selecting unit 254, the voltage controlled clock signal ($CK_{vco}$) with the voltage controlled frequency ($f_{vco}$) outputted by VCO 240 undergoes a first frequency division by the coefficient-selecting unit 254 and then becomes an output clock signal ($CK_{out}$) with an output frequency ($f_{out}$). Further, the output clock signal ($CK_{out}$) further undergoes a second frequency division by the main divider 252 according to the basic numeric M which divides the output frequency ($f_{out}$) of output clock signal ($CK_{out}$) by the integer M (multiplied by 1/M) to generate the frequency divided signal.

According to the embodiment of the present invention, the decision unit 260 and the PLL circuit 200 with multi-modulus divider are designed and integrated into an ASIC. In this way, the embodiment enables the PLL circuit 200 to have the characteristic of wide-locking range without using control pins to select one coefficient in the coefficient-selecting unit 254 by user.

The decision unit 260 comprises a lock detector 262, a comparator 264, an accumulator 266 and a switch controller 268. The comparator 264 receives and monitors the control voltage (Vc). When the control voltage (Vc) is smaller or larger than the standard voltage operation range, the comparator 264 will output pulses from either a low Vc terminal or a high Vc terminal to the accumulator 266. The accumulator 266 will count the number of pulses from low Vc terminal or the high Vc terminal. As the number accumulated by the accumulator 266 reach a predetermined value (X times), the accumulator 266 will generate an adjust-up signal (UP) or an adjust-down signal (DN) to the switch controller 268. The switch controller 268 can select a coefficient in the coefficient-selecting unit 254 according to the adjust-up signal (UP) or the adjust-down signal (DN). Further, the lock detector 262 receives the phase difference signal from the phase frequency detector 210 and determines whether the PLL circuit 200 is in a locked state or an unlocked state. When the lock detector 262 determines that the PLL circuit 200 is in the locked state, the lock detector 262 outputs a clear signal to the accumulator 266 to clear the number counted in the accumulator 266.

Figure 4:
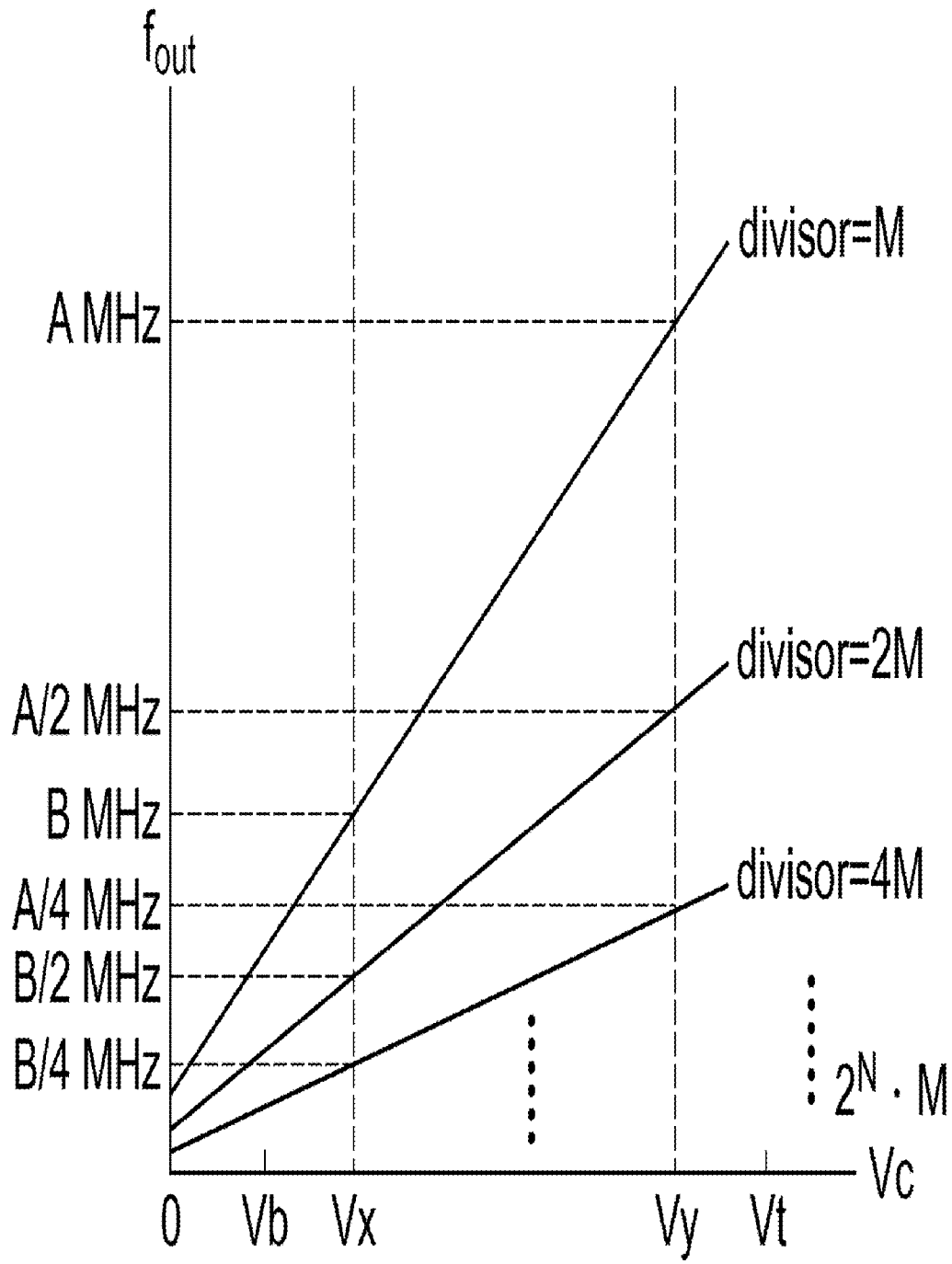
FIG. 4 illustrates the frequency operation range of the PLL circuit of the present invention.

Please refer to FIG. 4, which illustrates the frequency operation range of the PLL circuit of the present invention. The horizontal axis and vertical axis represent respectively the control voltage (Vc) and the output frequency ($f_{out}$) of output clock signal ($CK_{out}$). As illustrated, standard voltage operation range of the VCO 240 is in between Vx and Vy. When a divisor of the multi-modulus divider 250 is M, (multiply by 1/M), the frequency operation range of the PLL circuit 200 falls in between B MHz and A MHz; when the divisor of multi-modulus divider 250 is 2M, (multiply by ½M), the frequency operation range of the PLL circuit 200 falls in between B/2 MHz and A/2 MHz; when the divisor of the multi-modulus divider 250 is 4M, (multiply by ¼M), the frequency operation range of the PLL circuit 200 falls in between B/4 MHz and A/4 MHz; the same applies for the divisor of $2^N$ M. Therefore, the PLL circuit 200 of the present invention can be operated between B/4 MHz and A MHz. Similarly, the more coefficients in the coefficient-selecting unit 254 for selection, the wider the frequency operation range of the PLL circuit 200.

Figure 5:
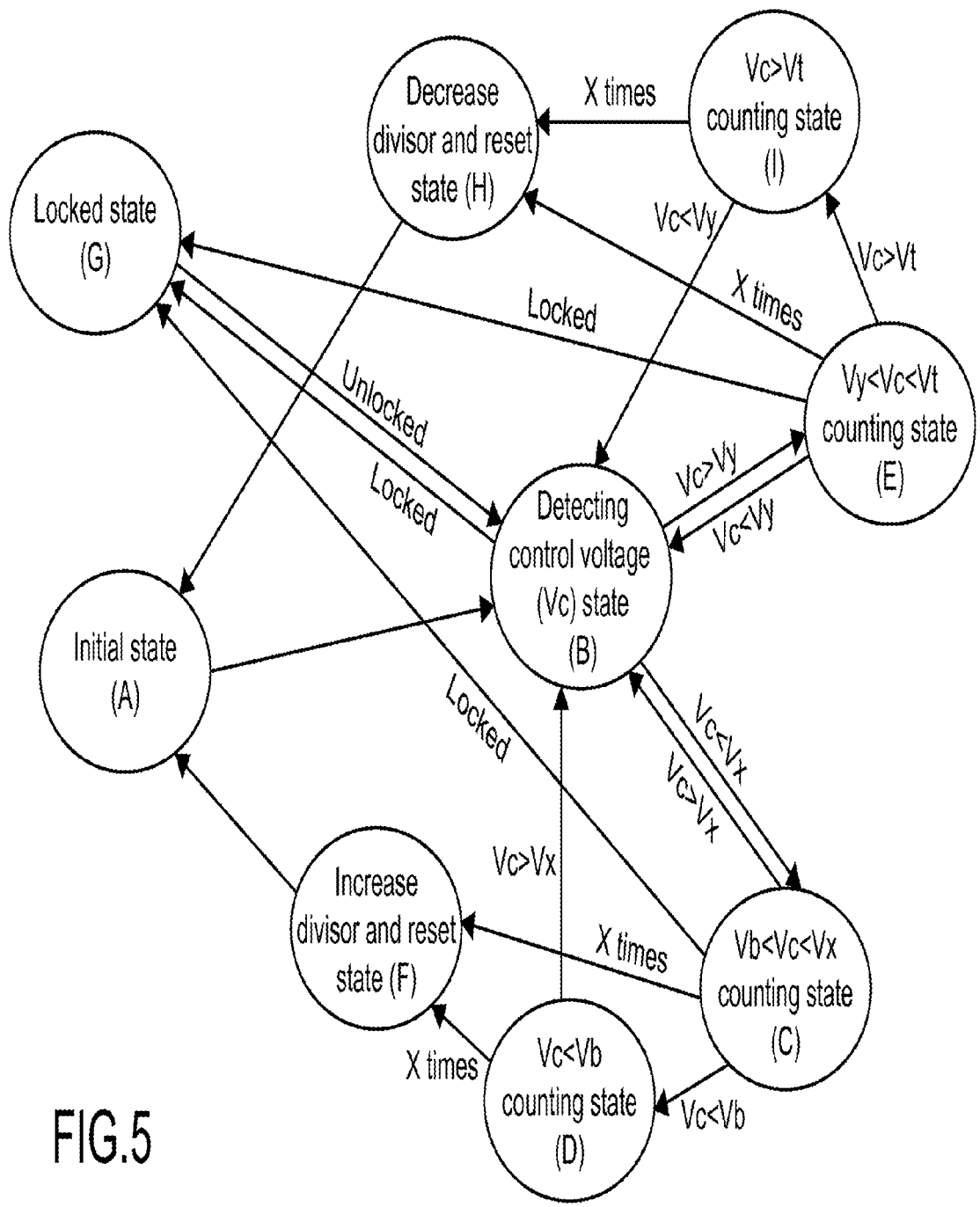
FIG. 5 illustrates the state diagram of the decision unit.

Please refer to FIG. 5, which illustrates the state diagram of the decision unit. When the PLL circuit 200 begins to operate, the decision unit 260 is in state A, which is the initial state. As input clock signal ($CK_{in}$) with reference frequency ($f_{ref}$) is input into PLL circuit 200, the control voltage (Vc) starts to change; and the decision unit 260 is in state B, which is the state of detecting control voltage (Vc). In state B, the comparator 264 of the decision unit 260 monitors whether the control voltage (Vc) is operated within the standard voltage operation range (Vx~Vy). When the control voltage (Vc) is operated within the standard voltage operation range (Vx~Vy) and the lock detector 262 confirms that the PLL circuit 200 has been locked, the decision unit 260 enters into state G, which is the locked state. In state G, when the lock detector 262 detects the PLL circuit 200 is unlocked, the decision unit 260 enters into state B.

Further, in state B, when the reference frequency ($f_{ref}$) of the input clock signal ($CK_{in}$) changes and makes the control voltage (Vc) smaller than Vx, the decision unit 260 enters into state C, which is a counting state in which Vb<Vc<Vx. In state C, the accumulator starts to count the number of pulses output from the low Vc terminal; from here, (1) when the control voltage (Vc) is larger than Vx and the number of pulses does not reach the predetermined value (X times), then the decision unit 260 enters into state B; (2) when the control voltage (Vc) is smaller than Vx and the number of pulses does not reach the predetermined value (X times) and the lock detector 262 confirms that PLL circuit 200 has been locked, then the decision unit 260 enters into state G; (3) when the control voltage (Vc) is even smaller than Vb and the number of pulses does not reach the predetermined value (X times), then the decision unit 260 enters into state D, which is a counting state in which Vc<Vb; and (4), when the control voltage (Vc) is smaller than Vx and the number of pulses reach the predetermined value (X times), then the decision unit 260 enters into state F, which is the state of increasing divisor and reset.

In State D, as control voltage (Vc) is already too low, the PLL circuit 200 is impossible to enter into state G (locked state). Therefore, unless reference frequency ($f_{ref}$) of input clock signal ($CK_{in}$) changes to enable the control voltage (Vc) larger than Vx again which causes the decision unit 260 to enter into state B, when the number of pulse reaches the predetermined value (X times), the decision unit 260 will enter into state F.

In state F, the switch controller 268 can select another coefficient from the coefficient-selecting unit 254 to increase the divisor of multi-modulus divider 252; for instance, increasing the divisor from M to 2M, or from divisor 2M to divisor 4M. After such, the decision unit 260 enters into state A and continues operation.

Further, in state B, when the reference frequency ($f_{ref}$) of the input clock signal ($CK_{in}$) changes and makes control voltage Vc larger than Vy, the decision unit 260 enters into state E, which is the counting state in which Vy<Vc<Vt. In state E, the accumulator starts to count number of pulses output from high Vc terminal. Following such, (1) when the control voltage (Vc) is smaller than Vy and the number of pulses is short of the predetermined value (X times), the decision unit 260 enters into state B; (2) when the control voltage (Vc) is larger than Vy, the number of pulses is short of the predetermined value (X times) and the lock detector 262 confirms that PLL circuit 200 has been locked, the decision unit 260 enters into state G; (3) when the control voltage (Vc) is further larger than Vt and the number of pulses does not reach the predetermined value (X times), the decision unit 260 enters into state I, which is the counting state in which Vc>Vt; and (4) when the control voltage (Vc) is larger than Vt and the number of pulses reach the predetermined value (X times), the decision unit 260 enters into state H, which is a state of decreasing divisor and reset.

In State I, as the control voltage (Vc) is already too high, the PLL circuit 200 is impossible to enter into state G (locked state). Thus, unless the reference frequency ($f_{ref}$) of input clock signal ($CK_{in}$) changes making the control voltage (Vc) smaller than Vy again to make the decision unit 260 enter into state B, when the number of pulses reaches the predetermined value (X times), the decision unit 260 enters into state H.

In state H, the switch controller 268 can select another coefficient from the coefficient-selecting unit 254 to decrease divisor of the multi-modulus divider 252; e.g. decreasing from divisor 2M to divisor M or from divisor 4M to divisor 2M. After such, the decision unit 260 then enters into state A and continues operation.

According to the embodiment of the present invention, the predetermined value (X times) is 24, and the frequency of pulses generated from low Vc terminal or high Vc terminal is $f_{ref}/256$. That is to say, when the control voltage (Vc) is not operated in the standard voltage operation range (Vx~Vy), the decision unit 260 can change the divisor of the multi-modulus divisor 250 after a period of $24*(256/f_{ref})$.

For instance, when the reference frequency ($f_{ref}$) of the input clock signal ($CK_{in}$) is very low, the output current from the charge pump 220 suppresses the control voltage (Vc), making the decision unit 260 enter into state C or D. After a period in which the PLL circuit 200 remains unlocked, the decision unit 260 will control the multi-modulus divider 250 to increase the divisor; after resetting, the control voltage (Vc) is returned to within the standard voltage operation range (Vx~Vy) and then the decision unit 260 enters into state G.

By the same logic, when the reference frequency ($f_{ref}$) of the input clock signal ($CK_{in}$) is very high, the output current from the charge pump 220 drive up the control voltage (Vc), and cause the decision unit 260 to enter into state E or I. After a period in which the PLL circuit 200 remains unlocked, the decision unit 260 will control the multi-modulus divider 250 to decrease divisor; the control voltage (Vc) is enabled to return to the standard voltage operation range (Vx~Vy) and then the decision unit 260 enters into state G.

Therefore, the present invention provides a wide-locking range phase locked loop circuit, which enables application of PLL circuit to the ASIC without an additional control pin that increases user's loading. The present invention of the decision unit 260 is also achieved using only digital circuit; hence it has a higher immunity against the disturbance from manufacturing process.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A phase locked loop circuit including:
   a phase frequency detector receiving a frequency divided signal and an input clock signal with a reference frequency and detecting the difference in phase and frequency between the input clock signal and the frequency divided signal and then outputting a phase difference signal;
   a charge pump outputting an output current in response to the phase difference signal;
   a loop filter generating a control voltage in response to the phase difference signal;
   a voltage controlled oscillator generating a voltage controlled clock signal with a voltage controlled frequency in response to the control voltage;
   a multi-modulus divider receiving the voltage controlled clock signal and then generating the frequency divided signal and an output clock signal with an output frequency, wherein a first divisor can be selected from a plurality of divisors provided by the multi-modulus divider to achieve a relation that the voltage controlled frequency divided by the first divisor equals the output frequency; and
   a decision unit receiving the phase difference signal and the control voltage and determining to select a second divisor form the plurality of divisors provided by the multi-modulus divider if the phase difference signal indicates an unlocked state and the control voltage is not within a standard voltage operation range.

2. The phase locked loop circuit according to claim 1 wherein the decision unit comprises:
   a main divider providing a basic numeric value; and
   a coefficient-selecting unit providing a plurality of coefficients and the plurality of coefficients multiplied by the basic numeric value being the plurality of divisors;
   wherein a first coefficient of the plurality of coefficients is selected by the decision unit for the coefficient-selecting unit to divide the voltage controlled frequency of the voltage controlled clock signal by the first coefficient and to generate the output clock signal with the output frequency and for the main divider to divide the output frequency of the output clock signal by the basic numeric value and to generate the frequency divided signal.

3. The phase locked loop circuit according to claim 1 wherein the multi-modulus divider comprises:
   a lock detector receiving the phase difference signal and outputting a clear signal if the phase difference signal indicates a locked state;
   a comparator receiving the control voltage and outputting pulses if the control voltage is not within the standard voltage operation range;
   an accumulator counting a number of pulses and generating an adjusting signal if the number is counted to a predetermined value and clearing the number if the clear signal is received; and
   a switch controller selecting a third divisor form the plurality of divisors provided by the multi-modulus divider in response to the adjusting signal.

4. The phase locked loop circuit according to claim 3 wherein a frequency of the pulses generated by the comparator is determined by the reference frequency of the input clock signal.

5. The phase locked loop circuit according to claim 3 wherein the pulses are outputted from a low Vc terminal if control voltage is smaller than the standard voltage operation range.

6. The phase locked loop circuit according to claim 5 wherein the adjusting signal is an adjust-up signal if the accumulator counts to the predetermined value.

7. The phase locked loop circuit according to claim 3 wherein the pulses are outputted from a high Vc terminal if control voltage is larger than the standard voltage operation range.

8. The phase locked loop circuit according to claim 7 wherein the adjusting signal is an adjust-down signal if the accumulator counts to the predetermined value.

9. The phase locked loop circuit according to claim 1 wherein the second divisor is larger than the first divisor if control voltage is smaller than the standard voltage operation range.

10. The phase locked loop circuit according to claim 1 wherein the second divisor is smaller than the first divisor if control voltage is larger than the standard voltage operation range.

* * * * *